(12) United States Patent
Wu

(10) Patent No.: US 11,493,549 B2
(45) Date of Patent: Nov. 8, 2022

(54) SYSTEM AND METHOD FOR PERFORMING LOOPBACK TEST ON PCIE INTERFACE

(71) Applicant: Hewlett Packard Enterprise Development LP, Houston, TX (US)

(72) Inventor: Min-Huang Wu, Taipei (TW)

(73) Assignee: Hewlett Packard Enterprise Development LP, Houston, TX (US)

( * ) Notice: Subject to any disclaimer, the term of this patent is extended or adjusted under 35 U.S.C. 154(b) by 326 days.

(21) Appl. No.: 16/903,200

(22) Filed: Jun. 16, 2020

(65) Prior Publication Data
US 2021/0389367 A1 Dec. 16, 2021

(51) Int. Cl.
| G01R 31/28 | (2006.01) |
| H05K 1/02 | (2006.01) |
| H01R 12/70 | (2011.01) |
| H01R 12/72 | (2011.01) |

(52) U.S. Cl.
CPC ..... *G01R 31/2812* (2013.01); *G01R 31/2808* (2013.01); *H05K 1/02* (2013.01); *H01R 12/707* (2013.01); *H01R 12/721* (2013.01); *H05K 2201/10189* (2013.01)

(58) Field of Classification Search
CPC .. G01R 31/2812; G01R 31/2808; H05K 1/02; H05K 2201/10189; H01R 12/707; H01R 12/721
USPC ....................................................... 324/763.01
See application file for complete search history.

(56) References Cited

U.S. PATENT DOCUMENTS

| 4,771,236 A * | 9/1988 | Banks ................. G01R 31/316 324/762.02 |
| 6,043,442 A * | 3/2000 | Park ....................... G01R 31/68 209/571 |
| 6,504,378 B1 * | 1/2003 | Renfrow ............ G01R 31/2886 324/750.16 |
| 8,963,568 B2 * | 2/2015 | Booman ............ H01R 13/6658 324/757.01 |
| 2001/0013786 A1 * | 8/2001 | Caggiano ........... G01R 31/2808 324/719 |
| 2011/0273202 A1 * | 11/2011 | Kim .................... G01R 31/2818 324/763.01 |

FOREIGN PATENT DOCUMENTS

| CN | 1161455 A | * | 10/1997 | .......... G01R 31/043 |
| CN | 1083577 C | * | 4/2002 | .......... G01R 31/043 |
| CN | 103323963 A | * | 9/2013 | .......... G02F 1/1309 |
| EP | 2515129 A2 | * | 10/2012 | ............. H02S 50/10 |
| FR | 2939925 A1 | * | 6/2010 | .......... G01R 31/048 |

* cited by examiner

*Primary Examiner* — Peter G Leigh
(74) *Attorney, Agent, or Firm* — Park, Vaughan, Fleming & Dowler LLP

(57) ABSTRACT

An apparatus is provided for testing a PCIe interface on a printed circuit assembly. The apparatus can include a plurality of electrical contacts to couple to a PCIe interface of the printed circuit assembly, wherein a respective electrical contact corresponds to a pin of the PCIe interface. The apparatus can also include a plurality of resistors. Each resistor is coupled between two adjacent electrical contacts. At least one electrical contact corresponds to a ground, power, or not connected (NC) pin of the PCIe interface, thereby allowing a loopback test to determine connectivity between the pins of the PCIe interface and the printed circuit assembly.

20 Claims, 7 Drawing Sheets

SYSTEM AND METHOD FOR PERFORMING LOOPBACK TEST ON PCIE INTERFACE

BACKGROUND

Field

This disclosure is generally related to testing of a printed circuit assembly. More specifically, this disclosure is related to a system and method for performing an optimized loopback test on Peripheral Component Interconnect Express (PCIe) connectors of the printed circuit assembly.

Related Art

Recent advancements in integrated circuit technologies have resulted in increasing density of components on printed circuit assemblies (PCAs). In general, a PCA can include a plurality of components that can be electrically coupled to each other by electrical paths or "nets" to perform a function for which the circuit is designed. These electrical paths can be of different types, e.g., conductive traces, vias, or solder.

The increasing density of components on PCAs can result in an increasing number of solder joints and an increasing likelihood of defective connections, and hence a greater demand for effective testing of the PCAs before the electronic product can be launched in the market. Various tests can be conducted on the PCAs to ensure correct functioning of the product.

BRIEF DESCRIPTION OF THE FIGURES

In the figures, like reference numerals refer to the same figure elements.

DETAILED DESCRIPTION

Figure 1:
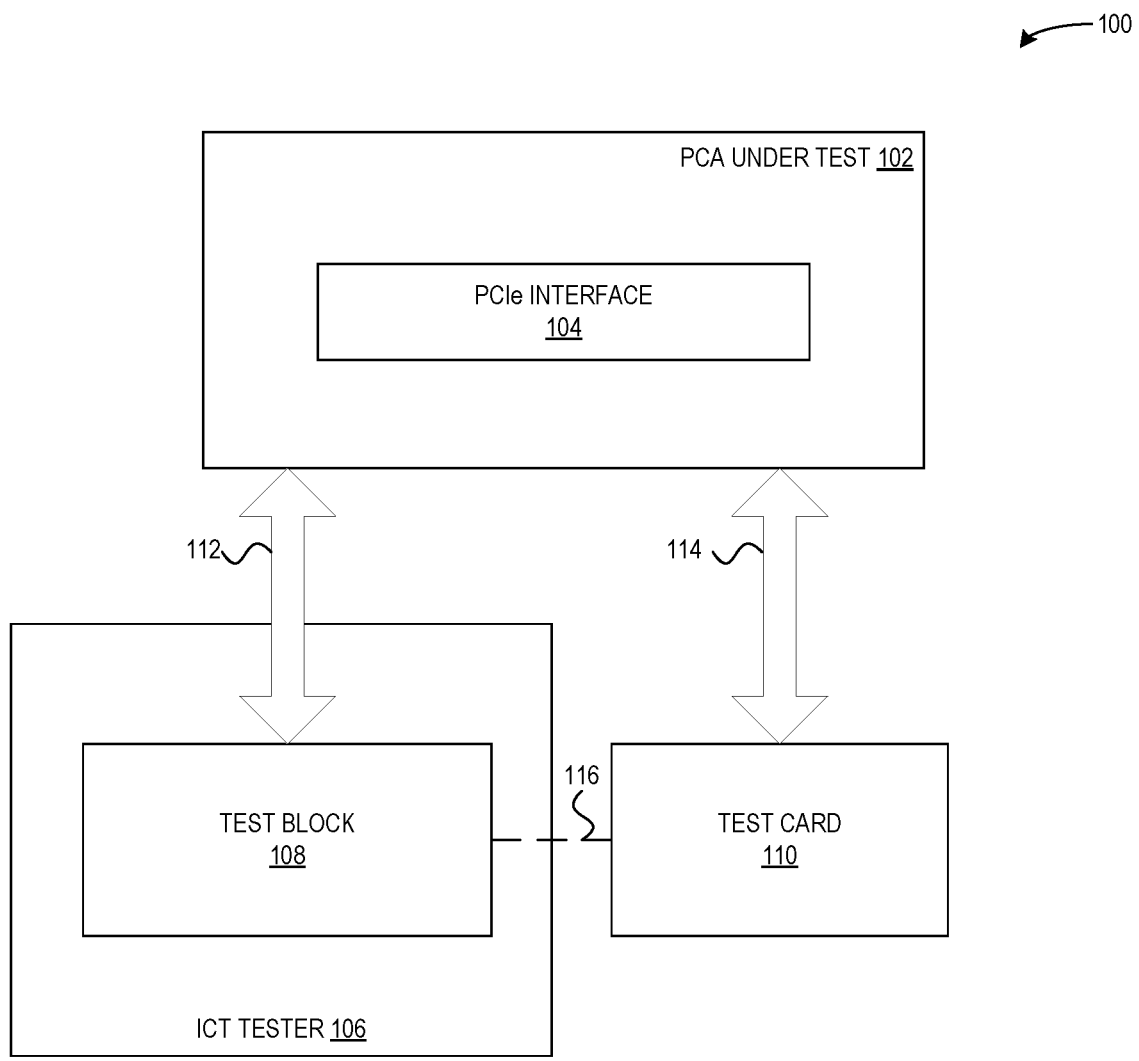
FIG. 1 illustrates an exemplary test system setup, according to one embodiment.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the scope of the present disclosure is not limited to the embodiments shown, but is to be accorded the widest scope consistent with the principles and features disclosed herein.

The embodiments described herein solve the technical problem of providing full pin coverage when testing connectivity between pins of a PCIe interface and a printed circuit assembly in a cost and time-efficient way by using a dedicated test card.

To enable large-scale production of complex PCAs an Automated Test Equipment (ATE) can be integrated into the manufacturing process. In general, two such automated testing techniques can be used for testing the PCAs: in-circuit test (ICT) and functional test (FCT). To conduct FCT, the PCAs can be powered on and the circuitry on the PCAs can operate as designed so that they can be tested for their functional correctness. Furthermore, an FCT tester may generate and apply different signals to the PCA to simulate the normal operation of the PCA, thereby verifying the PCA functionality.

To conduct ICT, the PCAs may or may not be powered on depending on the type of components being tested on the PCA. For example, ICT can be divided into two parts: testing of analog components and testing of digital components. When performing ICT on digital components of the PCA, the PCA may be powered on. In some cases, e.g., when performing ICT on analog components of the PCA, the PCA may remain powered off.

Existing testing mechanisms generally test connectors on PCA, e.g., PCIe connectors, using FCT which can take longer time than ICT. For example, FCT can take about several minutes to complete while ICT can complete a test in just a few seconds. Since a product can include many such PCAs, testing PCIe connectors on PCA using FCT would increase the testing time and hence the time-to-market.

To solve the aforementioned problems, embodiments described herein provide a system and method for performing an optimized loopback test on PCIe connectors of a PCA. The optimized loopback test on PCIe connectors of the PCA can be performed by using a dedicated test card on ICT testers, thereby providing full pin coverage of the PCIe connectors and saving testing time.

In one embodiment, the ICT tester can include a dedicated test card for performing the optimized loopback test on PCIe connectors. The test card can include a set of electrical contacts and a set of resistors. The set of electrical contacts can be electrically coupled to respective pins of a PCIe interface on the PCA under test. Each resistor in the set of resistors on the test card can be electrically connected between two electrical contacts on the test card. Since the electrical contacts are connected to the pins of the PCIe connector, each resistor can be coupled between two adjacent pins of the PCIe interface, thereby forming a set of loopback paths on the test card. Each loopback path can include a resistor and two adjacent pins to which the resistor is connected. For example, a resistor can be connected between a signal pin and a ground pin, a signal pin and a power pin, or a signal pin and a not connected (NC) pin, thereby providing full pin coverage to detect open circuit or short circuit pins of the PCIe interface by using loopback tests. The following paragraphs describe in detail an apparatus including the test card for testing the PCIe interface on the PCA under test.

In this disclosure, the term "test pad" or "probe pad" refers to a point on a "net" that can be accessible for probing, typically it is a point of contact for a probe and it is adapted to engage with a probe head.

The term "net" refers to electrical connections between components on a PCA. These electrical connections can be represented as electrically conductive paths on the PCA.

The term "probe" refers to an electrically conductive component of an ICT tester that can be used for connecting the ICT tester with a PCA under test for the purpose of testing. Specifically, one end of the probe can be electrically connected to the ICT tester and another end of the probe can be electrically connected to a "test pad" on the PCA under test.

The terms "connector" and "interface" are used interchangeably in the present disclosure.

Testing PCIe Connector Pins on a Printed Circuit Assembly

FIG. 1 illustrates an exemplary test system setup 100, according to one embodiment. In the example shown in FIG. 1, test system setup 100 can perform a loopback test on PCA under test 102. The test system can include an ICT tester 106. ICT tester 106 can further include a test block 108 which can be coupled via a communication link 116 to a test card 100 for testing PCA under test 102. PCA under test 102 can include at least a PCIe interface 104, which is to be tested. PCA under test 102 can be coupled to ICT tester 106 prior to testing PCIe interface 104. Test block 108 can optionally be an automatic test system that can generate probe signals and send the probe signals through a set of probes 112, which can be coupled to probe pads on PCA under test 102.

Test card 110 can be coupled via a set of electrical contacts 114 to PCIe interface 104, with each electrical contact corresponding to a respective pin on PCIe interface 104. Test card 110 can include a number of resistors, with each resistor being electrically connected between two adjacent pins of PCIe interface 104 to form a loopback path.

Test block 108 can be configured to measure resistance values of resistors on test card 110 and, based on the measured resistance values can determine a connectivity between all pins of PCIe interface 104 and PCA under test 102. For example, test block 108 can identify defective pins on PCIe interface 104 that are improperly mounted on PCA under test 102. Test card 110 can test all pins of PCIe interface 104, thereby providing a full pin coverage.

In one embodiment, test block 108 can be coupled to a display device to provide real-time visualization of loopback test results. For example, the test results may include information about whether the connectivity between PCIe interface pins and PCA under test 102 are good or defective. These visual test results can be viewed and analyzed by a quality test engineer. Detailed operation of test system setup 100 is described below in conjunction with to FIGS. 2A and 2B.

Figure 2A:
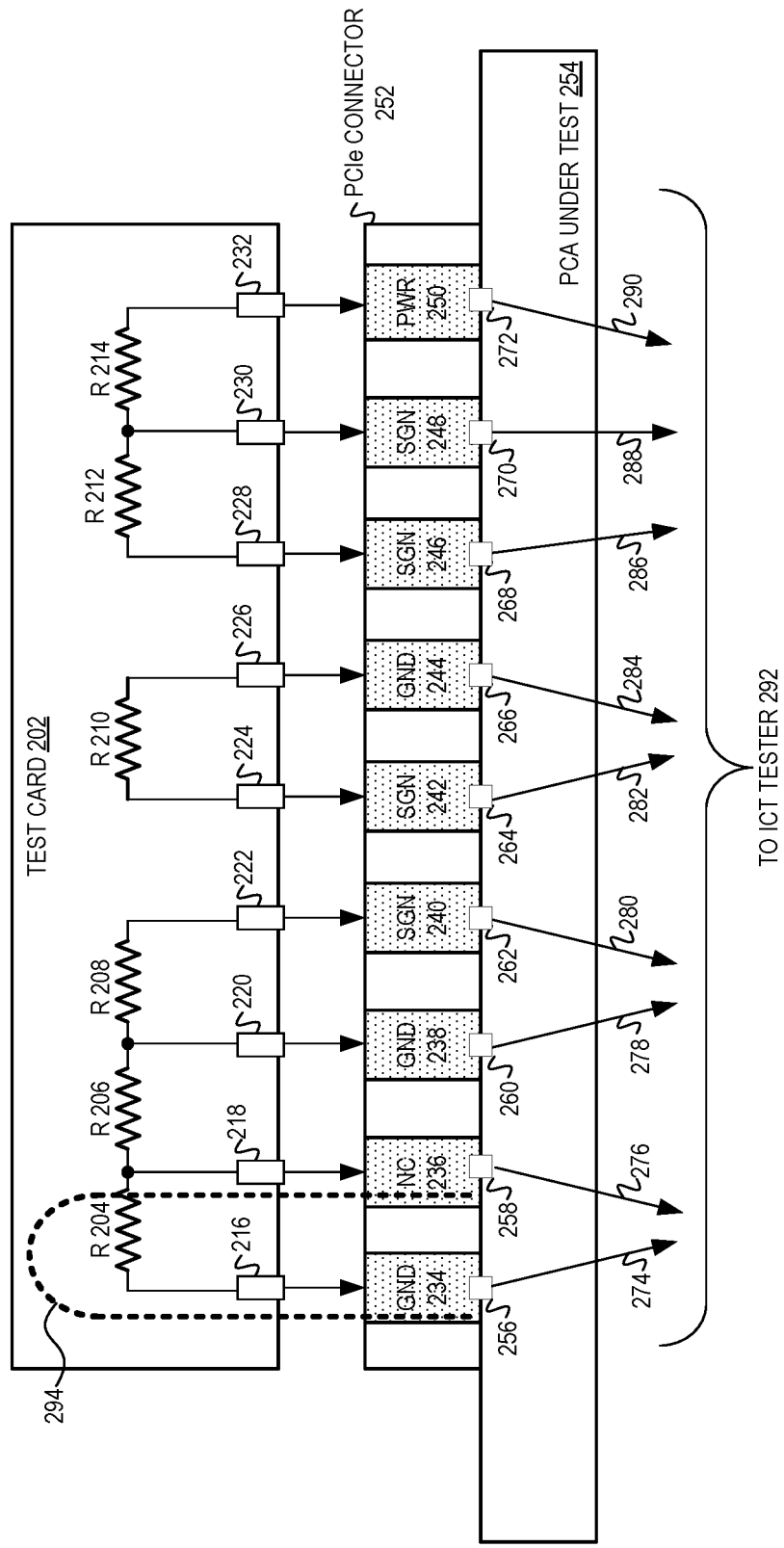
FIG. 2A illustrates an exemplary schematic diagram of the test system setup, according to one embodiment.

FIG. 2A illustrates an exemplary schematic diagram of a test system setup 200, according to one embodiment. In the example shown in FIG. 2A, test system setup 200 can include an ICT tester 292, a dedicated test card 202, a PCIe interface 252, and a PCA under test 254. PCA under test 254 can include PCIe interface 252 that is to be tested. For testing purposes, PCA under test 254 can be connected to ICT tester 292.

Test card 202 can be coupled to ICT tester 292 for performing a loopback test on the pins of PCIe interface 252. Test card 202 can include a plurality of electrical contacts 216-232. Each electrical contact can be coupled to a corresponding pin of PCIe interface 252. For example, electrical contacts 216, 218, 220, 222, 224, 226, 228, 230, and 232 can be connected to pins: ground (GND) pin 234, NC pin 236, GND pin 238, signal (SGN) pin 240, SGN pin 242, GND pin 244, SGN pin 246, SGN pin 248, and power (PWR) pin 250, respectively.

Test card 202 can include a plurality of resistors R 204-R 214. Each resistor can be connected between two adjacent electrical contacts on test card 202. For example, resistor R 104 can be connected between electrical contacts 216 and 218 to form a loopback path 294. In other words, loopback path 294 can include resistor R 204, electrical contacts 216 and 218, GND pin 234, and NC pin 236. Test card 202 can include a number of such loopback paths to cover all the pins on PCIe interface 252.

ICT tester 292 can further include a set of test probes 274-290 that can be in contact with a corresponding set of test pads 256, 258, 260, 262, 264, 266, 268, 270, and 272 on PCA under test 254. The test pads can each be coupled to a corresponding pin of PCIe interface 252, and can be fabricated on PCA 254 to facilitate testing. When in contact with these test pads test probes 274-290 can be used for measuring values of resistors R 204-R 214 on test card 102. In one embodiment, one end of each probe can be coupled to ICT tester 292 while another end (the probing end) can be in contact with a test pad on PCA under test 252.

In one embodiment, ICT tester 292 can include a test module (e.g., test block 108 in FIG. 1) that can generate probe signals. ICT tester 292 can use probes 274-290 to transmit the probe signals to test pads 256-272, which, under normal operation conditions, can pass on the probe signals to the corresponding pins of PCIe interface 252.

ICT tester 292 can use test card 202 to perform loopback tests on all pins 234-250 of PCIe interface 252. These loopback tests can be performed to determine whether the connectivity between electrical test pads 256-272 and corresponding pins 234-250 of PCIe interface 252 is broken or healthy. In one embodiment, the test system may determine that the connection between the pins of PCIe interface 252 and PCA under test 254 is good when the measured resistance values of all the resistors on test card 202 are correct or within a pre-determined range.

Figure 2B:
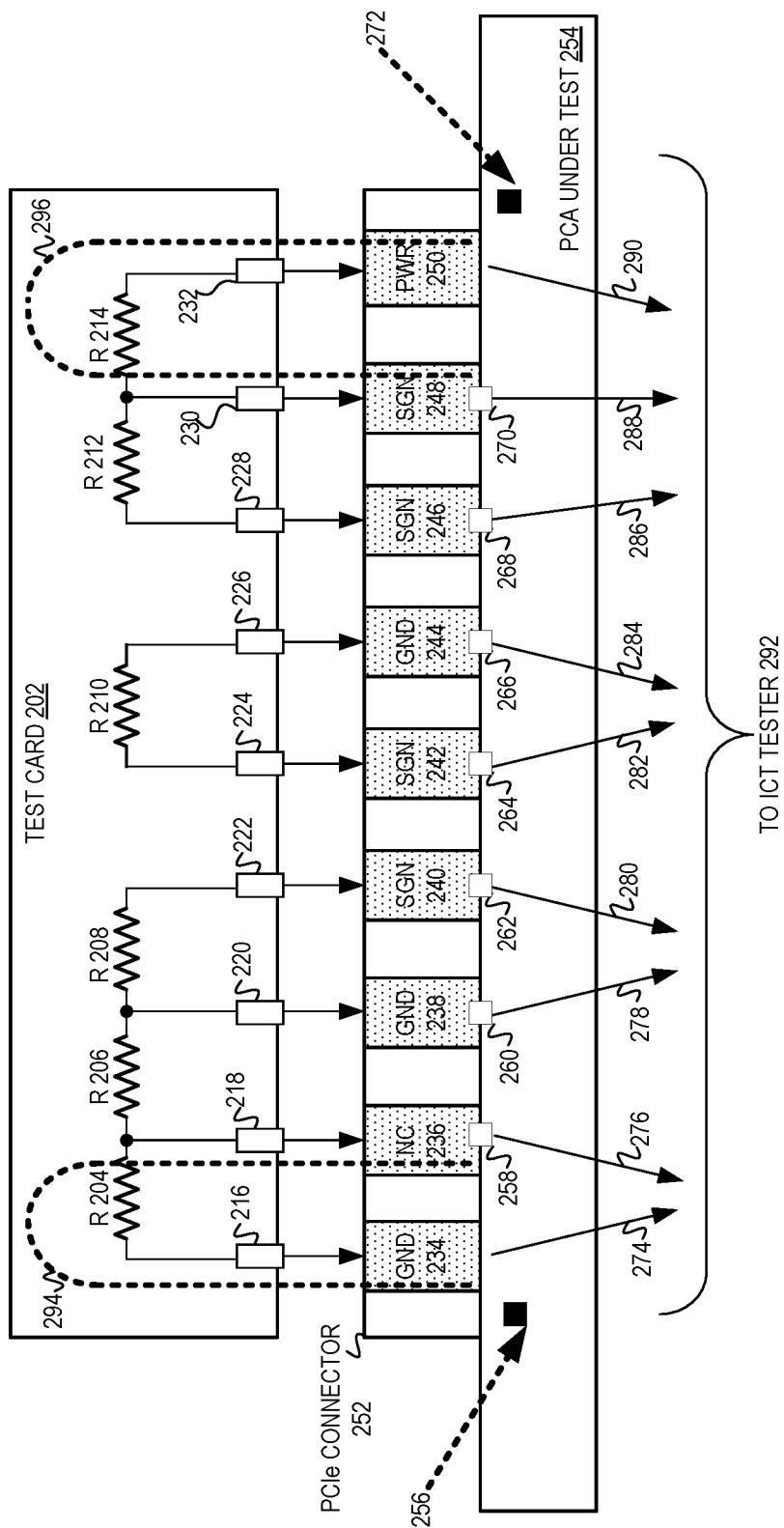
FIG. 2B illustrates an exemplary test system setup where defective connector pins are present, according to one embodiment.

FIG. 2B illustrates an exemplary test system setup where defective connector pins are present, according to one embodiment. In the example shown in FIG. 2B, the electrical connection between PCA 254 and GND pin 234 and PWR pin 250, respectively, is broken. A broken connection may indicate that there is a cold solder to the pin, which may result in an open circuit. Similarly, improper mounting of PCIe interface 252 on PCA under test 254 may result in a short circuit, wherein two pins are in contact or form a short circuit. When a pin is defective, i.e., there exists an open circuit or a short circuit, the test system in ICT tester 292 would not detect the correct resistance value in the loopback path including the defective pin.

In the example shown in FIG. 2B, the system may detect abnormal measurements of the resistor values in the two loopback paths 294 and 296. In one embodiment, the test system can measure resistance values of all resistors R 204-R 214 on test card 202. The test system can then identify the defective pins by analyzing the abnormal measured resistance values corresponding to loopback paths 294 and 296, respectively. Specifically, when the measured values of resistors R 204 and R 214 are outside a pre-determined tolerance range, the test system can determine that a defective pin is present in the loopback paths 294 and 296.

For example, if each of resistors R 204-R 214 have a value of 1 KΩ, then a tolerance range can be set at 10% of 1 KΩ, i.e., the tolerance range can be 0.9 KΩ-1.1 KΩ. If the measured resistance values are out of the tolerance range 0.9 KΩ-1.1KΩ, the system can determine that PCIe interface 252 may include defective pins. In the example shown in FIG. 2B, the system may measure out-of-range resistance values for resistors R 204 and R 214 in loopback paths 294 and 296, respectively. The system may then determine whether the out-of-range resistance values can be due to an open circuit or a short circuit of the PCIe pins in the corresponding loopback paths 294 and 296. In one embodiment, the system can detect an open circuit when the measured resistance value is above a first pre-specified threshold. For example, if the actual resistance value of a resistor is 1 KΩ, an open-circuit threshold for the measured resistance can be set at 1 MΩ. Other threshold values can also be used.

If the measured resistance value is below a second pre-specified threshold, the system can attribute the out-of-range resistance measurement to a short circuit. For example, if the actual resistance value of a resistor is 1 KΩ, a short-circuit threshold or the measured resistance can be set in the order of 5-10Ω. In the example shown in FIG. 2B, a short circuit can mean that electrical contacts associated with GND pin 234 and NC pin 236 may be shorted. In one embodiment, in response to determining the presence of an open circuit or a short circuit in the loopback paths 294 and 296, the system can perform further analysis or testing to locate the open pin or the shorted pin. PCA under test 254 may then be sent for repair of the defective pin (s) or for other corrective actions.

Figure 3A:
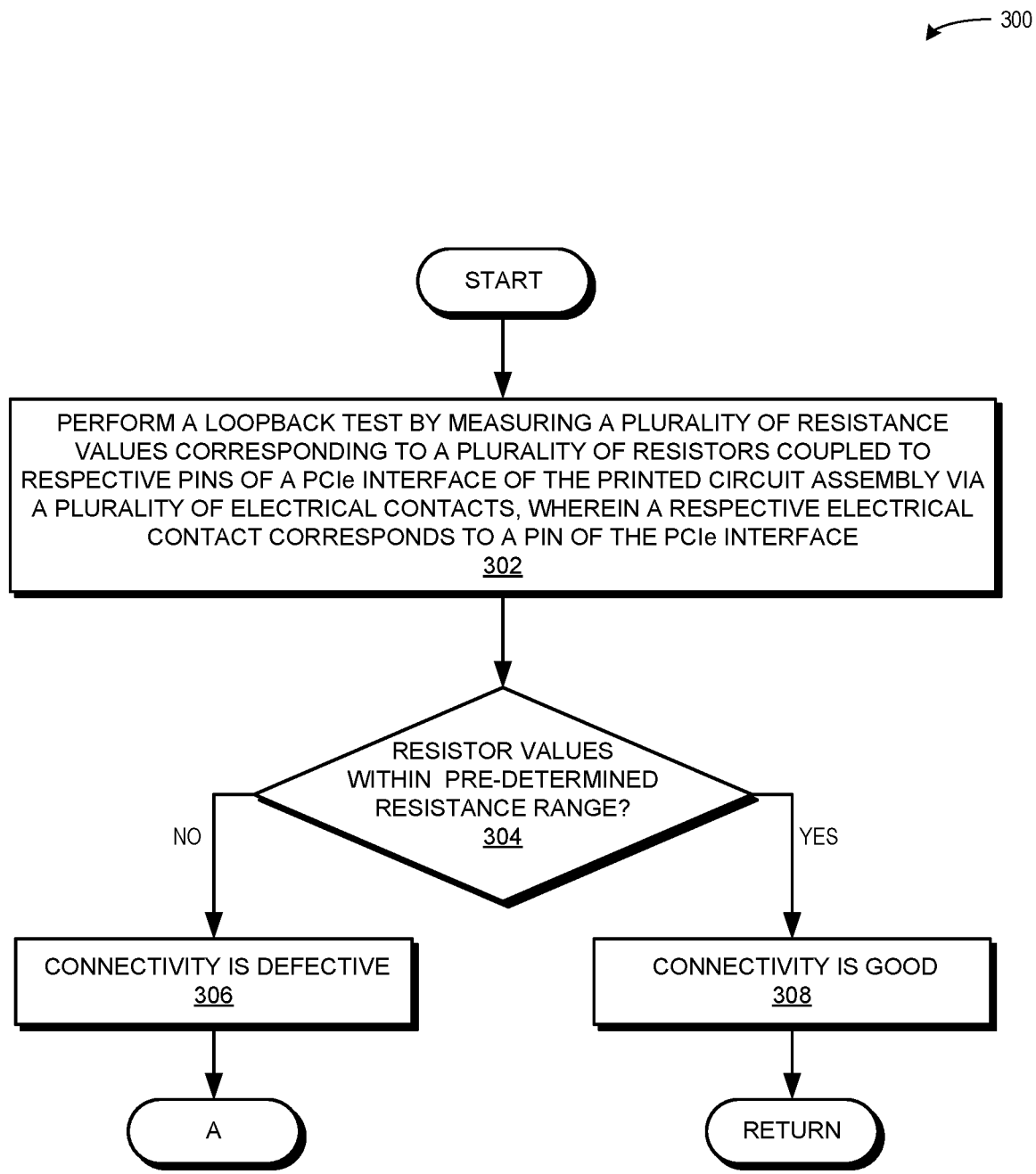
FIG. 3A presents a flowchart illustrating a process for testing a PCIe interface on a printed circuit assembly, according to one embodiment.
Figure 3B:
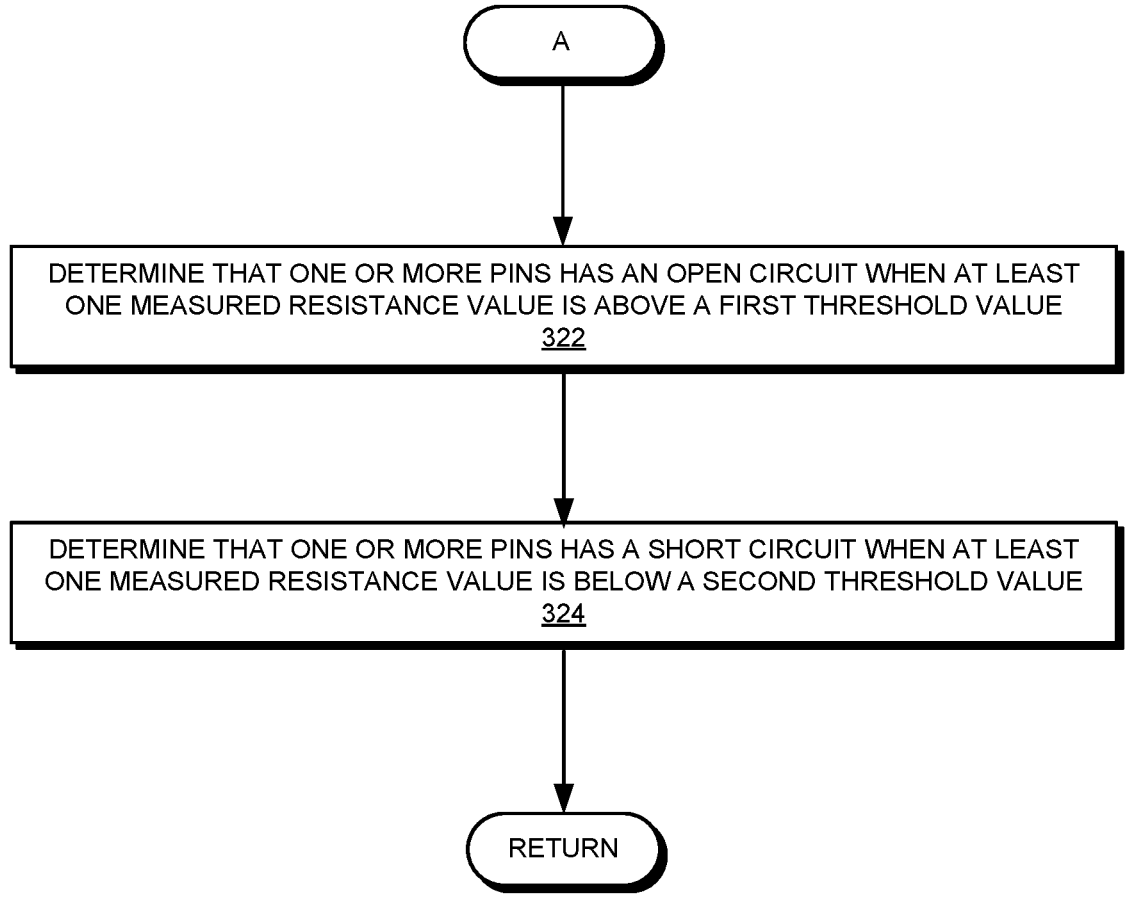
FIG. 3B presents a flowchart illustrating a process for testing a PCIe interface on the printed circuit assembly, according to one embodiment.

FIGS. 3A and 3B present a flowchart illustrating a process for testing a PCIe interface on a printed circuit assembly, according to one embodiment. Prior to initiating the testing process, a quality test engineer may set up testing equipment as shown in FIG. 2A. During operation, the system may send a probe signal to the PCIe pins by using probes in contact with test pads corresponding to each pin of the PCIe interface. The probe signal can flow through a plurality of loopback paths on the test card, with each loopback path including a resistor coupled between adjacent pins of the PCIe interface. The system may then use the probes to perform a loopback test by measuring a plurality of resistance values corresponding to the resistors on the test card (operation 302).

The system can then determine, based on the measured resistance values between adjacent probes, the connectivity between the pins of the PCIe interface and the printed circuit assembly. Specifically, the system may determine whether the measured resistance values of resistors is within a pre-determined resistance range (operation 304). If the condition in operation 304 is true, the system can determine that the connectivity between the pins of the PCIe connector and the PCA under test is good (operation 308) and the operation returns. If the condition in operation 304 is false, the system can further determine that the connectivity between at least one pin of the two pins connected to each resistor with an incorrect measurement can be defective (operation 306). (The operation continues at label A in FIG. 3B)

Referring to FIG. 3B, in response to determining that the connectivity is defective, the system can further analyze the out-of-range resistance values. Specifically, the system can determine whether the out-of-range resistance values are above a pre-specified first threshold. In other words, the system can determine that at least one of the pins corresponding to each loopback path associated with the out-of-range resistance value has an open circuit when the resistance value is above the first threshold (operation 322).

The system can further determine whether the out-of-range resistance value is below a pre-specified second threshold. In other words, the system can determine that the pins corresponding to the loopback path associated with the out-of-range resistance value has a short circuit when the resistance value is below the second threshold (operation 324) and the operation returns. In one embodiment, the system may measure the resistance values of all the resistors on the test card in parallel and may also determine in parallel the connectivity of all the pins of the PCIe interface.

Exemplary Computer System and Apparatus

Figure 4:
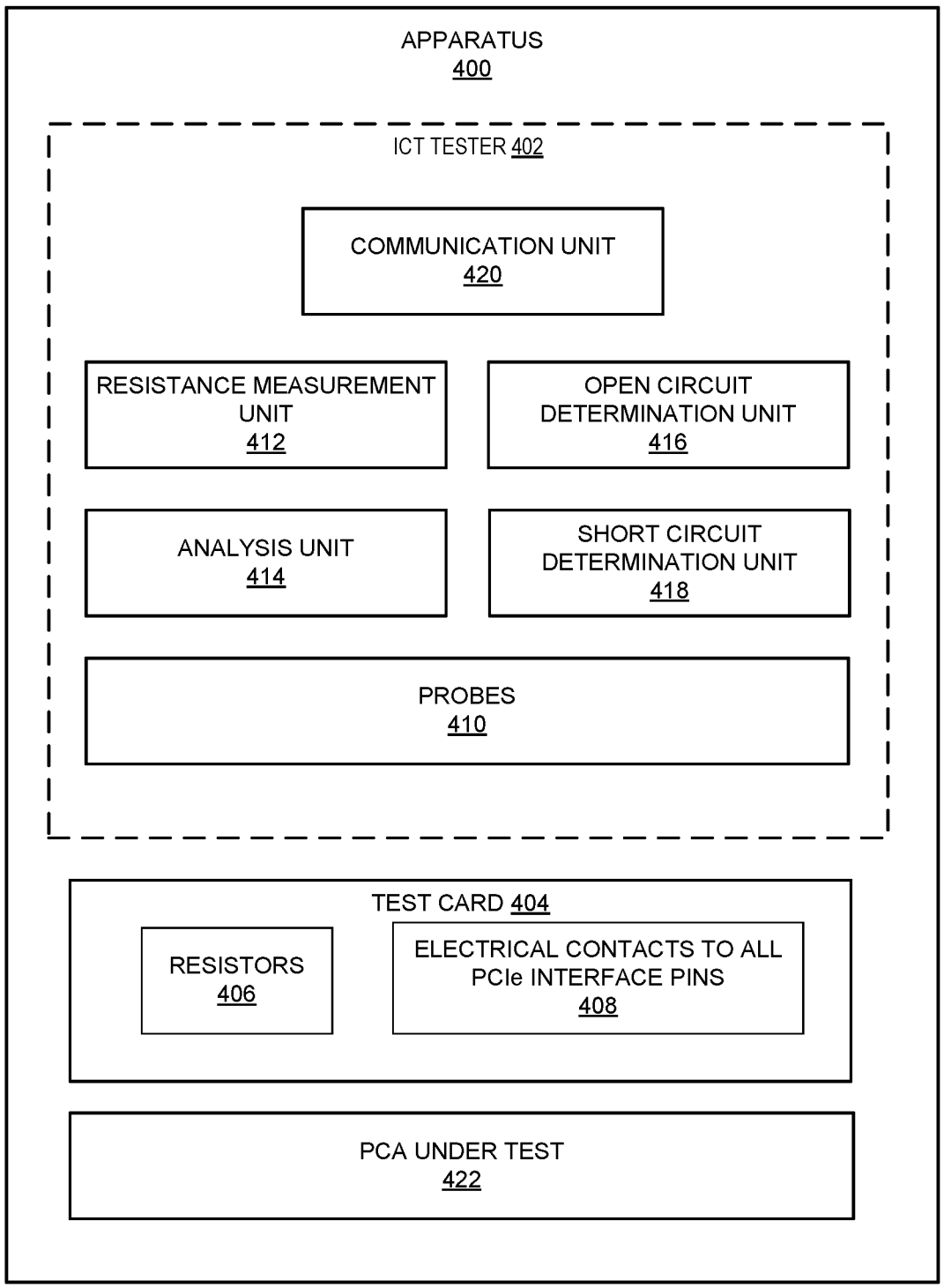
FIG. 4 illustrates an exemplary apparatus that facilitates the testing of the PCIe interface on the printed circuit assembly, according to one embodiment.

FIG. 4 illustrates an exemplary apparatus that facilitates the testing of the PCIe interface on the printed circuit assembly, according to one embodiment. Apparatus 400 can include an ICT tester 402 for testing a PCIe interface on a PCA under test 422. PCA under test 422 can be mounted on ICT tester 402. PCA under test 422 can include a PCIe interface with a set of pins, e.g., ground, NC, signal, power pins, etc., which can be tested for their connectivity to PCA under test 422. Each pin in the PCIe interface can be coupled to a test pad on PCA 422 that can be used as a contact point for testing.

Apparatus 400 can further include a test card 404 that can enable a loopback test on PCA under test 422. Specifically, test card 404 can include a plurality of resistors 406 and a set of electrical contacts 408 which can be couple to PCA under test 422 via the PCIe interface. Each electrical contact can be electrically coupled to a respective pin of the PCIe interface of PCA under test 422. Each resistor can be electrically connected between two adjacent electrical contacts to form a loopback path for performing the loopback test on the PCIe pins, thereby providing a complete fault coverage for all the pins of the PCIe interface.

ICT tester 402 can further include a plurality of probes 410 that can be in contact with a corresponding set of test pads provided on PCA 422. These test pads are used as electrical contact points for testing the connectivity between the PCIe pins and the corresponding electrical traces on PCA 422. Probes 410 can convey probe signals to PCA under test 422.

ICT tester 402 can include a resistance measurement unit 412 for measuring values of resistors 406 on test card 404. Resistance measurement unit 412 can use probes 410 coupled to the test pads to measure values of resistors 406 on test card 404. When the pins of the PCIe interface on PCA 422 have good connectivity to PCA 422, then resistance measurement unit 412 detects correct values of resistors in each loopback path on test card 404. When one or more pins of the PCIe interface are improperly connected to PCA 422 (e.g., open circuit or short circuit), resistance measurement unit 412 detects incorrect values of the resistors attached to the improperly connected pins. An analysis unit 414 can use the measured resistance values to determine whether the connectivity between the pins on PCIe interface of PCA under test 422 is good or defective.

In response to determining that the connectivity is defective, an open circuit determination unit 416 can then determine whether the defective connectivity is due to an open circuit between a PCIe pin on PCA 422 and the corresponding test pad. For example, if the resistance value of a resistor is above a first threshold then open circuit determination unit 416 may determine that at least one pin attached to the resistor is not correctly coupled to the corresponding test pad.

Short circuit determination unit 418 can determine whether the defective connectivity is due to a short circuit between pins attached to the resistors. For example, if the resistance value of a resistor is below a second threshold, short circuit determination unit 418 may determine that the two PCIe pins attached to the resistor has a short circuit.

ICT tester 402 can further include a communication unit 420 that can interface with a display device for displaying the results of the loopback test on PCIe interface of PCA under test 422.

Figure 5:
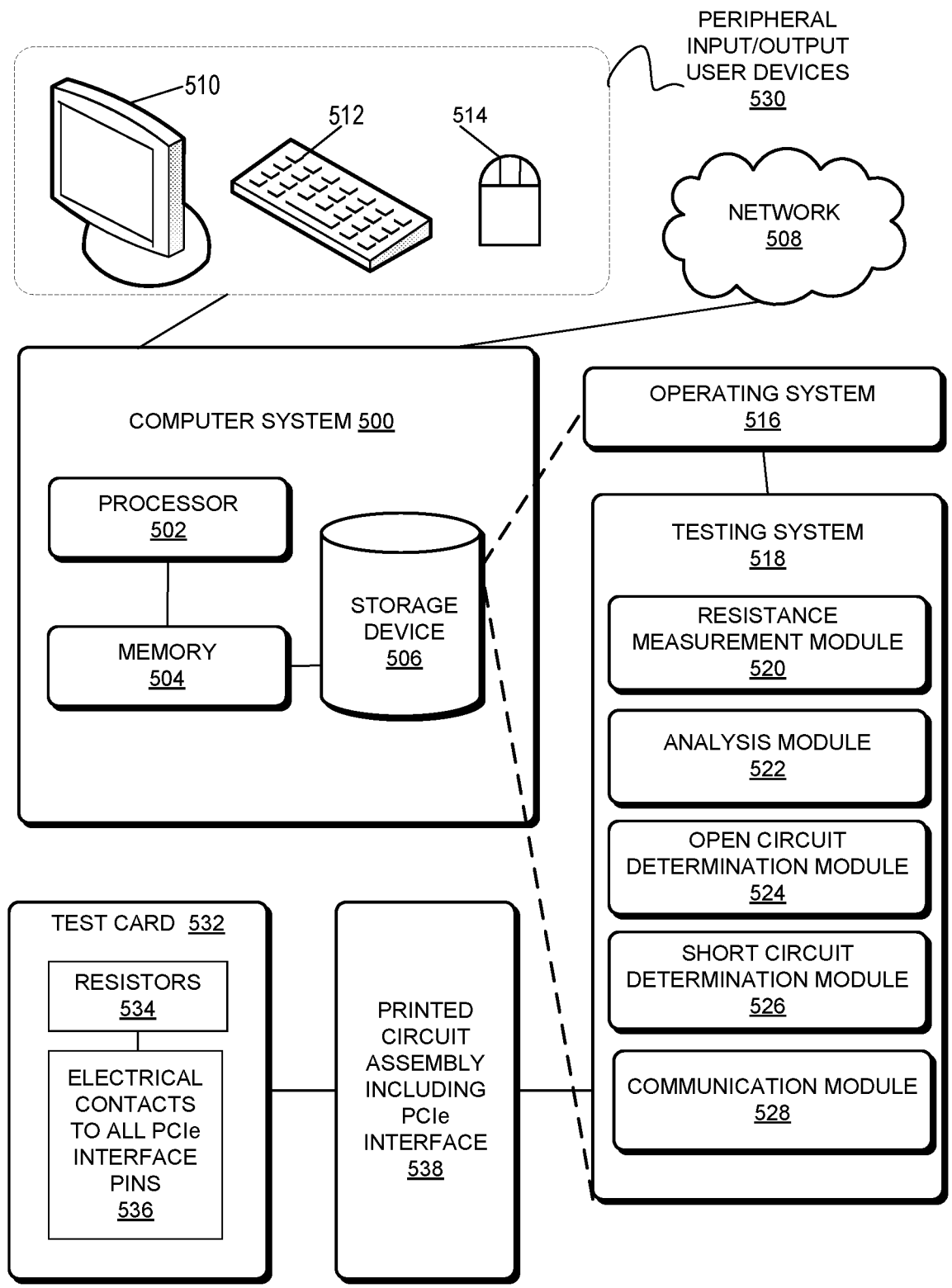
FIG. 5 illustrates an exemplary computer system that facilitates the testing of the PCIe interface on the printed circuit assembly, according to one embodiment.

FIG. 5 illustrates an exemplary computer system that facilitates the testing of the PCIe interface on the printed circuit assembly, according to one embodiment. Computer system 500 can include a processor 502, a memory 504, and a storage device 506. Furthermore, computer system 500 can be coupled to peripheral input/output (I/O) user devices 530, e.g., a display device 510, a keyboard 512, and a pointing device 514, and can also be coupled via one or more network interfaces to network 508. Storage device 506 can store an operating system 516 and a testing system 518. Testing system 518 can communicate with a test card 532 including a plurality of resistors 534 and electrical contacts to all PCIe interface pins 536. Testing system 518 can also communicate with a PCA 538 which includes a PCIe interface.

Testing system 518 can include instructions, which when executed by computer system 500, can cause computer system 500 to perform methods described in this disclosure. Specifically, testing system 518 can include instructions for measuring resistance values of resistors 534 on test card 532 (resistance measurement module 520). Testing system 518 can further include instructions for determining, based on the measured resistance values, whether the pins are good or defective (analysis module 522). Testing system 518 can include instructions for determining that a defective connectivity of the pins of the PCIe interface can be due to an open circuit (open circuit determination module 524) or a short circuit (short circuit determination module 526) of at least one pin of the PCIe interface. Testing system 518 can include instructions for sending the results of the loopback test to a display device (communication module 528). The displayed results can then be further analyzed by a quality test engineer for taking appropriate corrective actions when the connectivity between the pins of PCIe interface and the PCA is defective.

One embodiment can provide an apparatus for testing a PCIe interface on a printed circuit assembly. The apparatus can include a plurality of electrical contacts to couple to a PCIe interface of the printed circuit assembly. A respective electrical contact can correspond to a pin of the PCIe interface. The apparatus can further include a plurality of resistors, with each resistor coupled between two adjacent electrical contacts. At least one electrical contact can correspond to a ground, power, or not connected (NC) pin of the PCIe interface, thereby allowing a loopback test to determine connectivity between the pins of the PCIe interface and the printed circuit assembly.

In a variation on this embodiment, the apparatus can further include an in-circuit test module coupled to the plurality of resistors to perform the loopback test on the PCIe interface of the printed circuit assembly. The printed circuit assembly including the PCIe interface can be coupled to the in-circuit test module.

In a variation on this embodiment, the in-circuit test module can include a plurality of probes for measuring the resistance values of the plurality of resistors. One end of each probe can be electrically coupled to the in-circuit test module, while another end of the probe can be allowed to be in contact with a test pad which is on the printed circuit assembly an coupled to corresponding pin of the PCIe interface.

In a further variation on this embodiment, the in-circuit test module can be coupled to a display device for displaying results of the loopback test on the PCIe interface of the printed circuit assembly.

In a further variation, the in-circuit test module can determine that a connectivity between one or more pins of the PCIe interface and the printed circuit assembly is good when measured resistance values of resistors connected to the one or more pins are within a pre-determined resistance range.

In a further variation, the in-circuit test module can determine that a connectivity between one or more pins of the PCIe interface and the printed circuit assembly is defective when at least one measured resistance value of resistors connected to the one or more pins is outside a pre-determined resistance range.

In a further variation, in response to determining that the connectivity between the one or more pins of the PCIe interface and the printed circuit assembly is defective, the in-circuit test module is further to determine that the one or more pins can have an open circuit when at least one measured resistance value is above a first threshold value.

In a further variation, in response to determining that the connectivity between the one or more pins of the PCIe interface and the printed circuit assembly is defective, the in-circuit test module is further to determine that the one or more pins can have a short circuit when at least one measured resistance values is below a second threshold value.

In a further variation, the at least one electrical contact can further correspond to a signal pin.

In a further variation, the apparatus can further include a plurality of electrical loopback paths for performing the loopback test. Each electrical loopback path can include a resistor and two adjacent pins of the PCIe interface. The resistor can be coupled between two adjacent electrical contacts corresponding to the two adjacent pins. The plurality of loopback paths can cover all the pins on the PCIe interface.

In a further variation, each resistor can have a value greater than or equal to 1 KΩ.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described above can be included in hardware modules or apparatus. The hardware modules or apparatus can include, but are not limited to, application-specific integrated circuit (ASIC) chips, field-programmable gate arrays (FPGAs), dedicated or shared processors that execute a particular software module or a piece of code at a particular time, and other programmable-logic devices now known or later developed. When the hardware modules or apparatus are activated, they perform the methods and processes included within them.

The foregoing descriptions of embodiments have been presented for purposes of illustration and description only. They are not intended to be exhaustive or to limit the scope of this disclosure to the forms disclosed. Accordingly, many modifications and variations will be apparent to practitioners skilled in the art.

What is claimed is:

1. An apparatus for testing a printed circuit assembly, the apparatus comprising:
   a plurality of electrical contacts to couple to a PCIe interface of the printed circuit assembly, wherein a respective electrical contact corresponds to a pin of the PCIe interface; and
   a plurality of resistors, wherein each resistor is coupled between two adjacent electrical contacts, and wherein at least one electrical contact corresponds to a ground, power, or not connected (NC) pin of the PCIe interface, thereby allowing a loopback test to determine connectivity between the pins of the PCIe interface and the printed circuit assembly.

2. The apparatus of claim 1, further comprises:
an in-circuit test module coupled to the plurality of resistors to perform the loopback test on the PCIe interface of the printed circuit assembly, wherein the printed circuit assembly including the PCIe interface is coupled to the in-circuit test module.

3. The apparatus of claim 2, wherein the in-circuit test module comprises:
a plurality of probes for measuring resistance values of the plurality of resistors, wherein one end of each probe is electrically coupled to the in-circuit test module, while another end of the probe is allowed to be in contact with a test pad which is on the printed circuit assembly and coupled to corresponding pin of the PCIe interface.

4. The apparatus of claim 2, wherein the in-circuit test module is coupled to a display device for displaying results of the loopback test on the PCIe interface of the printed circuit assembly.

5. The apparatus of claim 2, wherein the in-circuit test module is to:
determine that a connectivity between one or more pins of the PCIe interface and the printed circuit assembly is good when measured resistance values of resistors connected to the one or more pins are within a pre-determined resistance range.

6. The apparatus of claim 2, wherein the in-circuit test module is to:
determine that a connectivity between one or more pins of the PCIe interface and the printed circuit assembly is defective when at least one measured resistance value of resistors connected to the one or more pins is outside a pre-determined resistance range.

7. The apparatus of claim 6, wherein, in response to determining that the connectivity between the one or more pins of the PCIe interface and the printed circuit assembly is defective, the in-circuit test module is further to determine that the one or more pins has an open circuit when at least one measured resistance value is above a first threshold value.

8. The apparatus of claim 6, wherein, in response to determining that the connectivity between the one or more pins of the PCIe interface and the printed circuit assembly is defective, the in-circuit test module is further to determine that one or more pins has a short circuit when at least one measured resistance value is below a second threshold value.

9. The apparatus of claim 1, wherein at least one electrical contact corresponds to a signal pin.

10. The apparatus of claim 1, further comprises:
a plurality of electrical loopback paths for performing the loopback test, wherein each electrical loopback path includes a resistor and two adjacent pins of the PCIe interface, wherein the resistor is coupled between two adjacent electrical contacts corresponding to the two adjacent pins, and wherein the plurality of loopback paths cover all the pins on the PCIe interface.

11. The apparatus of claim 1, wherein each resistor has a value greater than or equal to 1 KΩ.

12. A method for testing a printed circuit assembly, the method comprising:
performing a loopback test to determine connectivity between pins of a PCIe interface on the printed circuit assembly and a number of test pads on the printed circuit assembly, wherein the loopback test comprises:
measuring a plurality of resistance values corresponding to a plurality of resistors coupled to the PCIe interface of the printed circuit assembly via a plurality of electrical contacts, wherein a respective electrical contact corresponds to a pin of the PCIe interface, wherein each resistor is coupled between two adjacent electrical contacts, and wherein at least one electrical contact corresponds to a ground, power, or not connected (NC) pin of the PCIe interface.

13. The method of claim 12, further comprising:
performing the loopback test on the PCIe interface of the printed circuit assembly by using an in-circuit test module, wherein the in-circuit module is coupled to the plurality of resistors, and wherein the printed circuit assembly including the PCIe interface is coupled to the in-circuit test module.

14. The method of claim 13, further comprising:
displaying, on a display device, results of the loopback test on PCIe interface of the printed circuit assembly, wherein the display device is coupled to the in-circuit test module.

15. The method of claim 12, further comprising:
measuring the plurality of resistance values corresponding to the plurality of resistors by using a plurality of probes, wherein one end of each probe is electrically coupled to the in-circuit test module, while another end of the probe is allowed to be in contact with a test pad which is on the printed circuit assembly and coupled to corresponding pin of the PCIe interface.

16. The method of claim 12, wherein the loopback test further comprises:
determining that a connectivity between one or more pins of the PCIe interface and the printed circuit assembly is good when measured resistance values of resistors connected to the one or more pins are within a pre-determined resistance range.

17. The method of claim 12, wherein the loopback test further comprises:
determining that a connectivity between one or more pins of the PCIe interface and the printed circuit assembly is defective when at least one measured resistance value of resistors connected to the one or more pins is outside a pre-determined resistance range.

18. The method of claim 17, wherein in response to determining that the connectivity between the one or more pins of the PCIe interface and the printed circuit assembly is defective, the method further comprises determining that the one or more pins has an open circuit when at least one measured resistance values is above a first threshold value.

19. The method of claim 17, wherein in response to determining that the connectivity between the one or more pins of the PCIe interface and the printed circuit assembly is defective, the method further comprises determining that one or more pins has a short circuit when at least one measured resistance value is below a second threshold value.

20. A system, comprising:
a PCIe interface of a printed circuit assembly;
a plurality of electrical contacts to couple to the PCIe interface, wherein a respective electrical contact corresponds to a pin of the PCIe interface; and a plurality of resistors, wherein each resistor is coupled between two adjacent electrical contacts, and wherein at least one electrical contact corresponds to a ground, power, or not connected (NC) pin of the PCIe interface, thereby allowing a loopback test to determine connectivity between the pins of the PCIe interface and the printed circuit assembly.

\* \* \* \* \*